(12) United States Patent
Burcea

(10) Patent No.: US 8,502,588 B2
(45) Date of Patent: Aug. 6, 2013

(54) CLOCK GENERATION SYSTEM

(75) Inventor: George Burcea, Ajax (CA)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 13/408,435

(22) Filed: Feb. 29, 2012

(65) Prior Publication Data

US 2012/0286830 A1   Nov. 15, 2012

(30) Foreign Application Priority Data

May 12, 2011   (EP) ..................................... 11165809

(51) Int. Cl.
*H03K 3/00* (2006.01)
(52) U.S. Cl.
USPC ............................. 327/295; 327/156; 327/115
(58) Field of Classification Search
USPC ................. 327/115, 117, 144–147, 156, 159, 327/291, 293, 295
See application file for complete search history.

(56) References Cited

U.S. PATENT DOCUMENTS

| | | | |
|---|---|---|---|
| 8,207,762 B2 * | 6/2012 | Burcea | 327/117 |
| 8,390,348 B2 * | 3/2013 | Burcea | 327/156 |
| 2006/0214708 A1 * | 9/2006 | Huang et al. | 327/156 |
| 2008/0197897 A1 | 8/2008 | Fujii et al. | |
| 2010/0201408 A1 | 8/2010 | Burcea | |
| 2012/0262207 A1 * | 10/2012 | Burcea | 327/115 |

FOREIGN PATENT DOCUMENTS

EP   2 207 263   7/2010

OTHER PUBLICATIONS

Lin, Tsung-Hsien Lin et al IEEE Journal of Solid-State Circuits, vol. 42, No. 2, Feb. 2007, pp. 340-349.
Tsai, Meng-Ting Tsai et al Electronics, Circuits and Systems, Dec. 11, 2007, pp. 1384-1387, XP031248520, Section: II, Frequency Synthesizer Architecture, Section: III, Circuit implementation A. Phase Alignment and Time-to-Voltage Converter; p. 1385-p. 1386.

* cited by examiner

*Primary Examiner* — Long Nguyen
(74) *Attorney, Agent, or Firm* — Cozen O'Connor

(57) ABSTRACT

A clock generation system for generating first and second clock signals at slightly different clock frequencies comprising a clock signal generator providing the first clock signal, frequency dividers dividing the clock frequencies by integers to produce auxiliary signals, a timer for measuring a first time lag between first signal edges of the auxiliary signals and a second time lag between second signal edges of the auxiliary signals, a comparator device for providing an error signal by comparing the difference between the measured time lags with a predetermined time value, and a voltage-controlled oscillator controlled in dependent on the error signal to generate the second clock signal.

5 Claims, 4 Drawing Sheets

CLOCK GENERATION SYSTEM

BACKGROUND OF THE INVENTION

1. Field of the Invention

The present invention relates to control systems and, more particularly, to a clock generation system for generating a first clock signal at a first clock frequency and a second clock signal at a second clock frequency with a predetermined ratio to the first clock frequency.

2. Description of the Related Art

EP 2 207 263 A1 discloses a clock system that includes a clock signal generator providing a first clock signal at a first clock frequency f, a first frequency divider dividing the first clock frequency by a first integer N to produce a first auxiliary signal, a second frequency divider dividing a second clock frequency by a second integer K to produce a second auxiliary signal, a phase/period comparator generating an error signal by comparing the first and second auxiliary signals, and a voltage-controlled oscillator (VCO) controlled dependent on the error signal to generate the second clock signal at the second clock frequency $K/N \cdot f$.

The phase/period comparator, voltage-controlled oscillator and second frequency divider form a phase-locked loop (PLL) which locks onto a multiple, K, of its input frequency f/N so that the ratio of the second and first clock frequencies is K/N.

In practice, the frequencies of the first and second clock frequencies may be only slightly different, e.g., 3.000000 MHz and 2.999970 MHz, which thereby requires the integer divisors N=300000 and K=299997. Accordingly, a major disadvantage of this conventional clock generation system may be a long response time because the frequency multiplication is performed by the PLL and each frequency adjustment can only be made after the two signals are checked around the coincidence moment when N periods of the first clock signal=K periods of the second clock signal. Several corrections are necessary to lock the PLL, and when large N and K divider ratios are required, it takes a very long time to bring the PLL into lock.

SUMMARY OF THE INVENTION

It is therefore an object of the invention to provide two clock signals of slightly different frequencies with defined time or phase delay.

This and other objects and advantages are achieved in accordance with the invention by a clock generation system comprising a clock signal generator providing the first clock signal at a first clock frequency, a first frequency divider dividing the first clock frequency by a first integer to produce a first auxiliary signal, a second frequency divider dividing a second clock frequency by a second integer to produce a second auxiliary signal, a timer for measuring a first time lag between a first signal edge of the first auxiliary signal and a first signal edge of the second auxiliary signal and for measuring a second time lag between a second signal edge of the first auxiliary signals and a second signal edge of the second auxiliary signal, a comparator device for providing an error signal by comparing the difference between the measured time lags with a predetermined time value, and a voltage-controlled oscillator controlled dependent on the error signal to generate the second clock signal.

Accordingly, the ratio of the first and second clock frequencies no longer only depends on the first and second integers but it also depends on the predetermined time value, which allows for finer adjustment of the difference of the frequencies at lower values of the first and second integers. As a result, the loop lock time is shortened because the adjustment of the frequency of the voltage-controlled oscillator is performed after a much shorter time than the time to reach coincidence between the first and second clock signal.

Any error, such as propagation delay variation, offset and slope errors, occurring in the signal processing chain between the frequency dividers and the comparator device where the difference between the measured time lags is determined will equally affect both time lags and thus will be cancelled by the subtraction of the time lags.

In a preferred embodiment of the system in accordance with the invention, the timer comprises a time-to-voltage converter that offers a high time resolution.

The predetermined time value may be easily obtained by temporarily switching the system in an adjustment mode, where the first clock signal instead of the second clock signal is connected to the second frequency divider, and where the difference between the time lags measured in the adjustment mode is multiplied by a factor to obtain the predetermined time value. This adjustment mode may be repeated regularly or from time-to-time in order to compensate for component variations due to temperature changes or aging.

The first and second frequency dividers may be configured to adjust the first and second integers to optimize the gain of the phase-locked loop and to obtain a sufficiently high error signal.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

The invention will be now further described by way of preferred example and with reference to the accompanying drawing, in which.

DETAILED DESCRIPTION OF THE PREFERRED EMBODIMENTS

Figure 1:
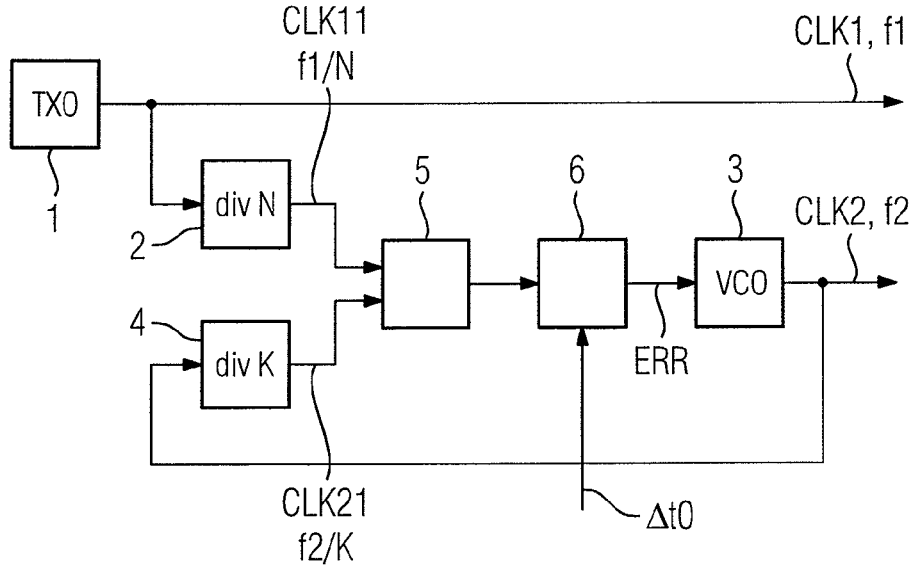
FIG. 1 is a schematic block diagram of the clock generation system in accordance with the invention.

FIG. 1 shows a clock generation system in which a clock signal generator 1 provides a first clock signal CLK1 at a first clock frequency f1. A first frequency divider 2 divides the first clock frequency f1 by a first integer N to produce a first auxiliary signal CLK11. A second clock signal CLK2 with a second clock frequency f2 is generated by a voltage-controlled oscillator (VCO) 3 and, in a second frequency divider 4, divided by a second integer K to produce a second auxiliary signal CLK21. As described below in more detail, a timer 5 measures a first time lag between first signal edges of the first and second auxiliary signals CLK11, CLK21 and after that a second time lag between second signal edges of the first and second auxiliary signals CLK11, CLK21. A comparator device 6 generates an error signal ERR by comparing the difference between the measured time lags with a predetermined time value $\Delta t0$. The error signal ERR is fed, e.g., through a phase-locked loop (PLL) filter (not shown), to the voltage-controlled oscillator 3 that generates the second clock signal CLK2.

Figure 2:
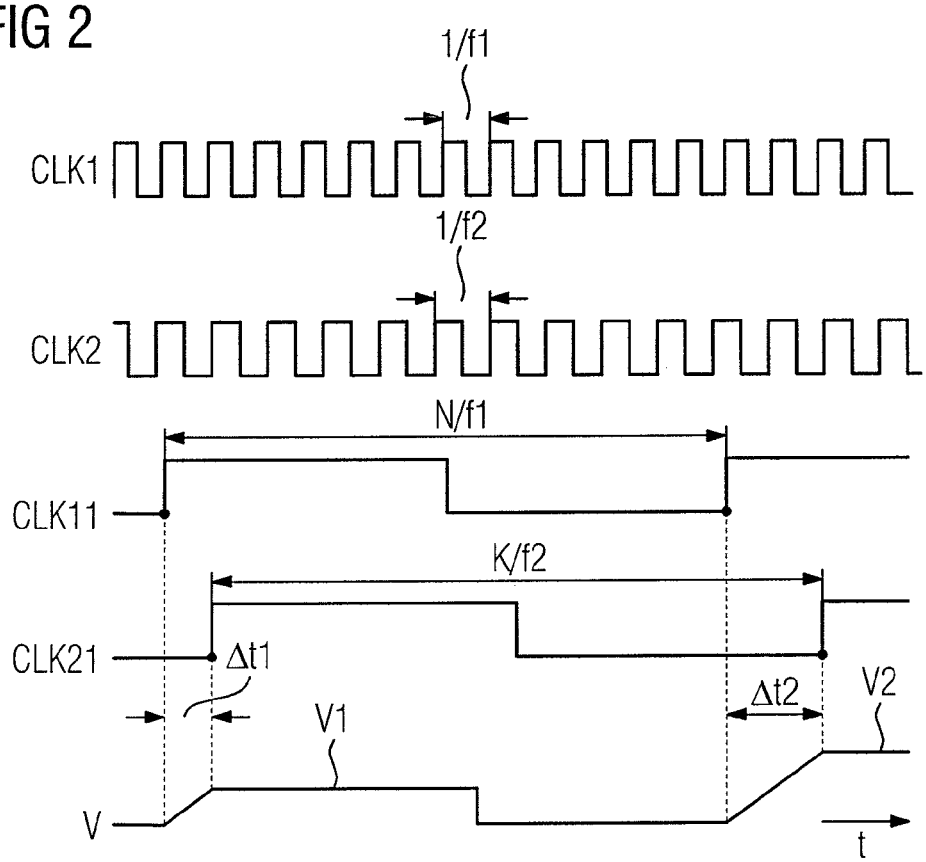
FIG. 2 is graphical plot of a timing diagram showing signals generated by the clock generation system of FIG. 1.

FIG. 2 shows a graphical plot of a timing diagram of the signals CLK1, CLK2, CLK11 and CLK21. The first clock signal CLK1 has a period of 1/f1 and the second clock signal CLK2 has a period of 1/f2. Due to the frequency division by N and K, respectively, the first auxiliary signal CLK11 has a period of N/f1 and the second auxiliary signal CLK21 has a period of K/f2. In this example, the timer 5 measures the first time lag $\Delta t1$ between a rising signal edge of the first auxiliary signal CLK11 and the following rising signal edge of the second auxiliary signal CLK21. One period of the first auxiliary signal CLK11 later, the timer 5 measures the second time lag $\Delta t2$ between the rising signal edge of the first auxiliary signal CLK11 and the following rising signal edge of the second auxiliary signal CLK21. Alternatively, the falling signal edges may be used instead of the rising edges. Thus, the following relationships are obtained:

$$N/f1+\Delta t2=K/f2+\Delta t1$$

or $$K/f2-N/f1=\Delta t2-\Delta t1.$$

The comparator device 6 compares the time lag difference $\Delta t1-\Delta t2$ with a predetermined time value $\Delta t0$ and generates, based on this comparison, the error signal ERR for controlling the voltage-controlled oscillator 3. Consequently, the PLL comprised of the components 3, 4, 5, and 6 controls the time lag difference $\Delta t1-\Delta t2$ at the constant time value $\Delta t0$ so that the ratio of the first and second clock frequencies f1 and f2 no longer only depends on the first and second integers n and K but also depends on the predetermined time value $\Delta t0$.

For example, in conventional clock systems, the first and second clock frequencies of f1=3.000000 MHz and f2=2.999970 MHz ((f1-f2)/f1=10 ppm) require the integer divisors N=300000 and K=299997.

The same frequencies are generated by the clock generation system of FIG. 1 operating in accordance with the timing diagram of FIG. 2 and having the following parameters:

$$N = K = 1000$$

and $$\begin{aligned}\Delta t0 &= K/f2 - N/f1 \\ &= N \cdot [(f1-f2)/f1] \cdot 1/f2 \\ &= 1000 \cdot 10 \text{ ppm} \cdot 1/f2 \\ &= 1\% \cdot 1/f2.\end{aligned}$$

Figure 3:
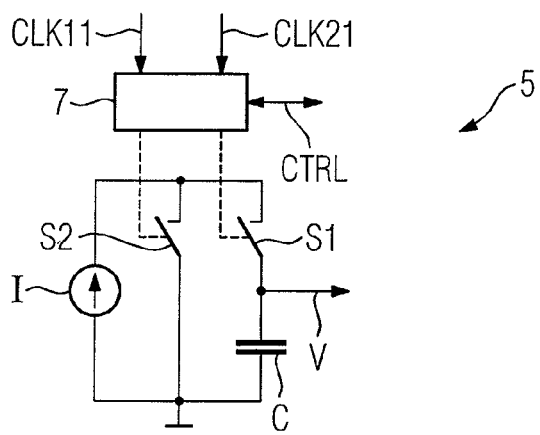
FIG. 3 is an exemplary time-to-voltage converter that forms part of the clock generation system of FIG. 1.

FIG. 3 shows a simplified example of the timer 5 that comprises a time-to-voltage converter. This time-to-voltage converter has a constant current source I in series with a capacitor C and a first switch S1. A second switch S2 is in parallel with the constant current source I. The switches S1 and S2 are controlled by the first and auxiliary signals CLK11 and CLK21 via a logic block 7. The first switch S1 is turned on by each rising edge of the first signal CLK11 and turned off by each rising edge of the second signal CLK21. The second switch S2 is turned on for a short period of time when the first switch S1 is open. Each time that the first switch S1 is closed, the capacitor C is charged to a voltage V which is proportional to the respective time lags $\Delta t1$ and $\Delta t2$:

$$V1=G\cdot \Delta t1 \text{ and } V2=G\cdot \Delta t2.$$

FIG. 2 shows the voltage V over the capacitor C.

Figure 4:
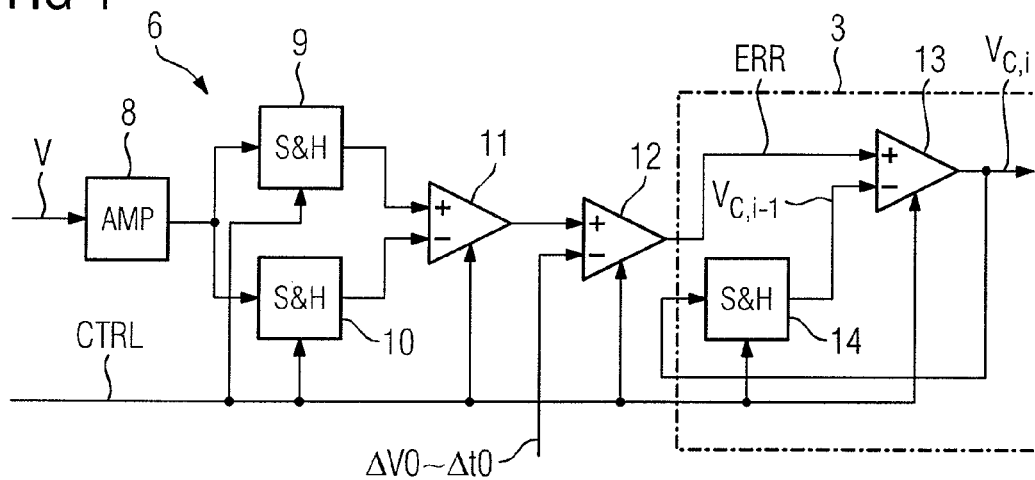
FIG. 4 is an exemplary embodiment of a comparator device that forms part of the clock generation system shown in FIG. 1.

FIG. 4 shows an embodiment of a mixed analog and digital design of the comparator device 6 together with an input section of the voltage-controlled oscillator 3. The voltage values V1, V2 provided by the time-to-voltage converter (timer 5) are amplified by an amplifier 8 and buffered in sample-and-hold circuits 9, 10. Two differential amplifiers 11 and 12 produce the error signal:

$$ERR=(V2-V1)-\Delta V0,$$

where $V2 \sim \Delta t2$, $V1 \sim \Delta t1$ and $\Delta V0 \sim \Delta t0$, so that:

$$ERR \sim (\Delta t2-\Delta t1)-\Delta t0.$$

The input section of the voltage-controlled oscillator 3 comprises another differential amplifier 13 whose output is fed back through a sample-and-hold circuit 14 to its one input and which receives at the other input the error signal ERR. After every two measurements, the control voltage $V_C$ of the voltage-controlled oscillator 3 is adjusted by an amount proportional to ERR so that the control voltage $V_C$ changes from the previous value $V_{C,i-1}$ to a new value $V_{C,i}$, where $V_{C,i} = V_{C,i-1} - k \cdot ERR$. In this way, the voltage-controlled oscillator 3 is successively adjusted to bring and maintain the frequencies f1 and f2 into conformance with the relationship $K/f2-N/f1=\Delta t0$.

The timing of the components 9, 10, 11, 12, 13, 14 is controlled by a control signal CTRL provided by the logic block 7 of the timer 5 (see FIG. 3).

Figure 5:
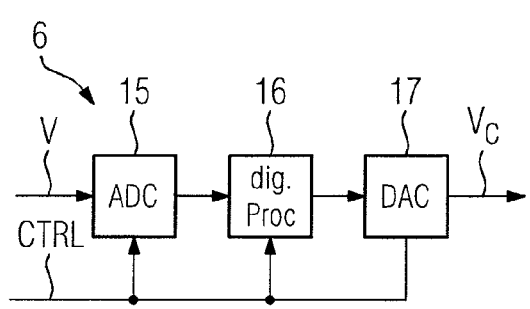
FIG. 5 is an alternative exemplary embodiment of a comparator device that forms part of the clock generation system shown in FIG. 1.

FIG. 5 shows an alternative embodiment of the above-described comparator device 6 where the amplifier 8 and sample-and-hold circuits 9, 10 are replaced by an analog-to-digital converter 15 and where the differential amplifiers 11, 12, 13 and the sample-and-hold circuit 14 are replaced by a digital processor 16 and digital-to-analog converter 17. In all other respects, the comparator device 6 operates in similar manner as described above.

Figure 6:
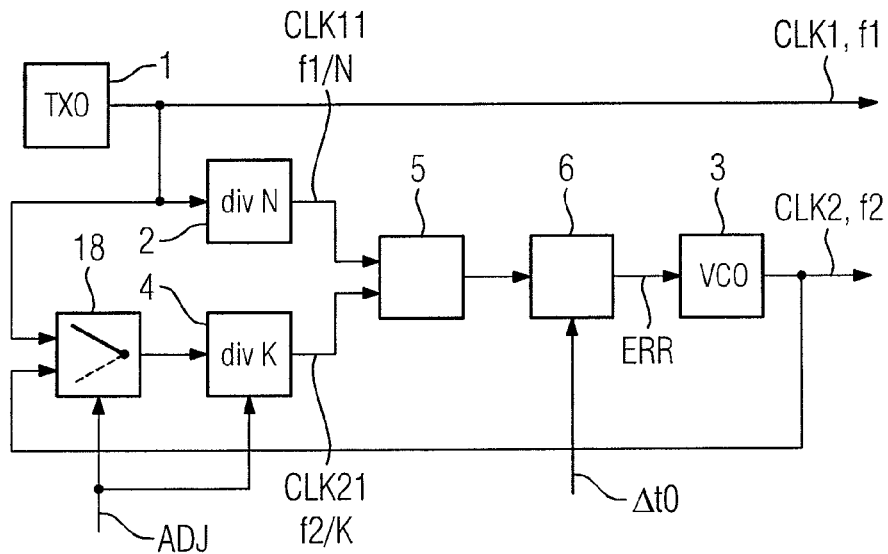
FIG. 6 is an alternative embodiment of the clock generation system in accordance with the invention.

FIG. 6 shows a further embodiment of the clock generation system, which differs from that of FIG. 1 in that a change-over switch or two-to-one multiplexer 18 is provided for either connecting the first clock signal CLK1 or the second clock signal CLK2 to the second frequency divider 4. In a calibration or adjustment mode, the switch 18 is controlled by a control signal ADJ to connect the first clock signal CLK1 to the second frequency divider 4. This gives the following relationship:

$$N/f1+\Delta t2'=K/f1+\Delta t1'$$

or $$(K-N)/f1=\Delta t2'-\Delta t1'=\Delta t0'.$$

Consequently, the comparator device 6 measures the time lag difference $\Delta t0'$ and the differential amplifier 11 outputs a voltage $\Delta V0' \sim \Delta t0'$. This value $\Delta t0'$ or $\Delta V0'$ is now multiplied by a suitable factor x to obtain the predetermined time value $\Delta t0 = x \cdot \Delta t0'$ or $\Delta V0 = x \cdot \Delta V0'$. The clock generation system is now switched back to the normal clock generation mode in that the second clock signal CLK2 is supplied to the second frequency divider 4, where:

$$K/f2 - N/f1 = \Delta t2 - \Delta t1 = x \cdot \Delta t0' = x \cdot (K-N)/f1$$

or $$f2/f1 = (K/N)/(x \cdot K/N + 1 - x)$$

or $$x = [(K/N) \cdot (f1/f2) - 1]/[(K/N) - 1].$$

For the exemplary equalities K=2N or K/N=2, the following relationships are obtained:

$$f2/f1 = 2/(1+x)$$

or $$x = 2f1/f2 - 1.$$

Figure 7:
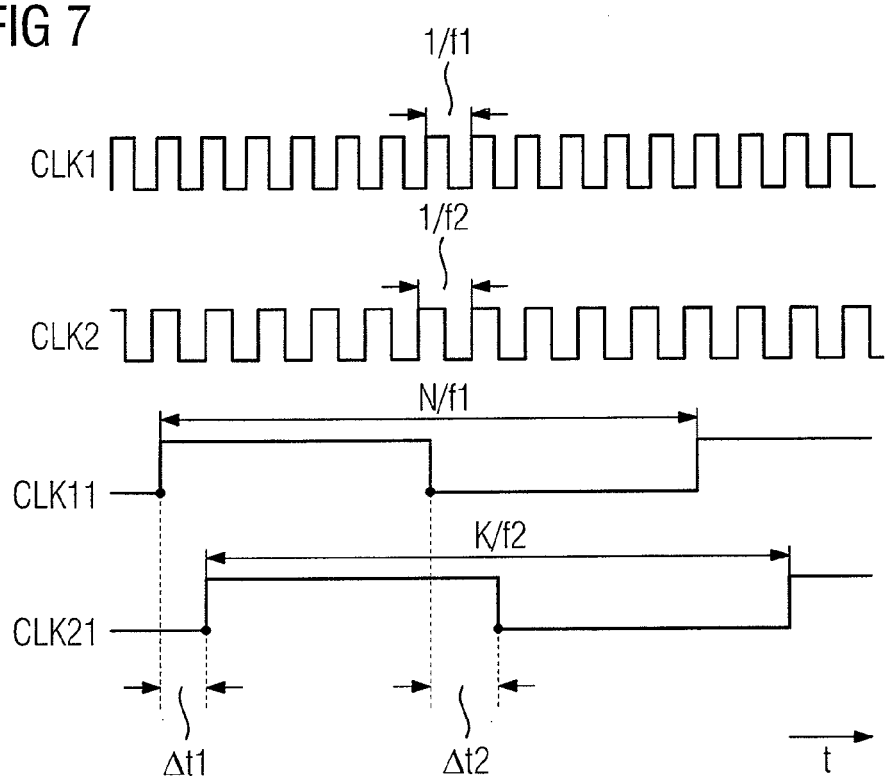
FIGS. 7 and 8 are further exemplary graphical plots of a timing scheme for the signals generated by the clock generation system.

FIG. 7 shows another timing scheme for the signals CLK1, CLK2, CLK11 and CLK21 which differs from that of FIG. 2 in that the timer 5 successively measures the first time lag $\Delta t1$ between the rising signal edges of the auxiliary signal CLK11, CLK21 and the second time lag $\Delta t2$ between the following falling signal edges of the auxiliary signals CLK11, CLK21. This gives the following relationship:

$$N/2f1 + \Delta t2 = K/2f2 + \Delta t1$$

or $$K/2f2 - N/2f1 = \Delta t2 - \Delta t1.$$

Figure 8:
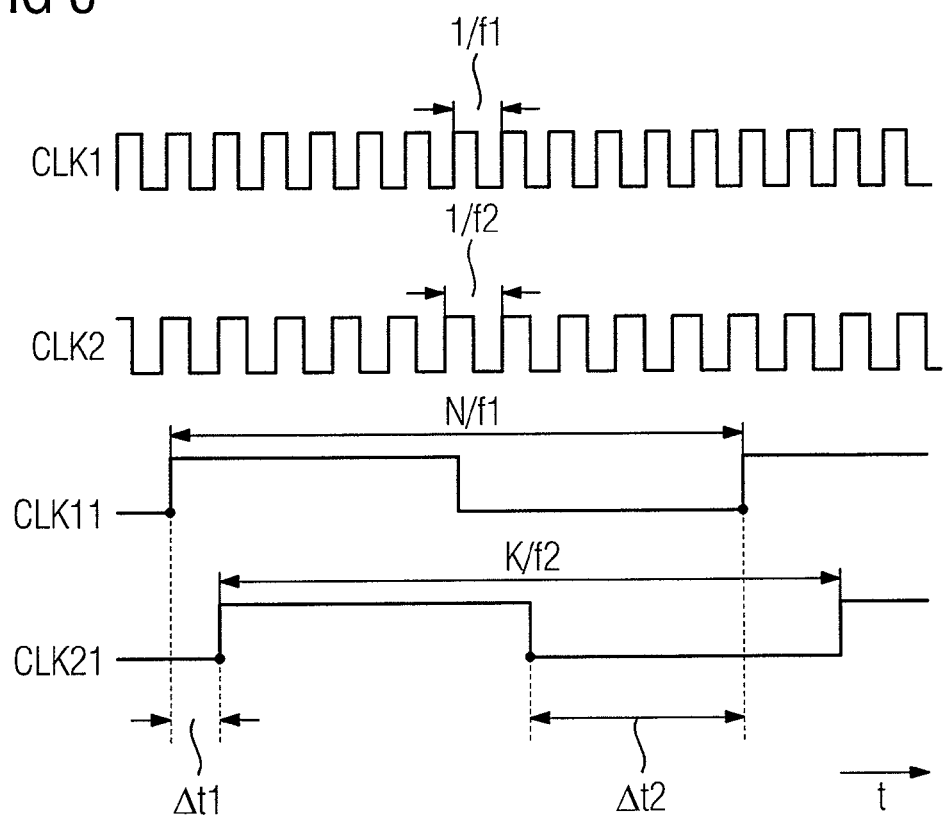

FIG. 8 shows yet another timing scheme for the signals CLK1, CLK2, CLK11 and CLK21 which differs from that of FIGS. 2 and 6 in that the timer 5 first measures the first time lag $\Delta t1$ between the rising signal edges of the auxiliary signal CLK11, CLK21 and after that the second time lag $\Delta t2$ between the following falling signal edge of the second auxiliary signal CLK21 and the following rising signal edge of the first auxiliary signal CLK21. This gives:

$$N/f1 = K/2f2 + \Delta t1 + \Delta t2$$

or $$N/f1 - K/2f2 = \Delta t1 + \Delta t2.$$

The time lags $\Delta t1$ and $\Delta t2$ are further processed in the same manner as described above with reference to FIGS. 2-5. Consequently, the comparator device 6 compares the time lag difference $\Delta t1 - \Delta t2$ with a predetermined time value $\Delta t0$ and generates, based on this comparison, the error signal ERR for controlling the voltage-controlled oscillator 3. In the case of the timing scheme of FIG. 7, the second time lag $\Delta t2$ is actually negative which, in practice, makes the difference $\Delta t1 - \Delta t2$ a summation. Therefore, the differential amplifier 11 of FIG. 4 is replaced by a summation amplifier.

The divider factors N and K of the frequency dividers 2 and 4 may be variable to allow for progressive gain adjustment when generating the error signal ERR. At the beginning of the adjustment cycle, the error signal ERR is expected to have a large value so that a large gain is not necessary, and the divider factors may be set to lower values, such as 100. This allows proper signal scaling and avoids saturation. As the voltage-controlled oscillator 3 is adjusted, the value of the error signal ERR decreases and the loop gain can be increased using larger divider factors N and K, such as 1000. After the second clock frequency f2 is brought even closer to the target value, the divider factors N, K can be increased once more, such as 10000, and have increased sensitivity to maintain the second clock frequency f2 at the desired value. Changing the divider factors N, K is equivalent with changing the gain for the error signal ERR.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements which perform substantially the same function in substantially the same way to achieve the same results are within the scope of the invention. Moreover, it should be recognized that structures and/or elements shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A clock generation system for generating a first clock signal at a first clock frequency and a second clock signal at a second clock frequency with a predetermined ratio to the first clock frequency, the system comprising:
 a clock signal generator providing the first clock signal at the first clock frequency;
 a first frequency divider dividing the first clock frequency by a first integer to produce a first auxiliary signal;
 a second frequency divider dividing the second clock frequency by a second integer to produce a second auxiliary signal;
 a timer configured to measure a first time lag between a first signal edge of the first auxiliary signal and a first signal edge of the second auxiliary signal and to measure a second time lag between a second signal edge of the first auxiliary signal and a second signal edge of the second auxiliary signal;
 a comparator device configured to provide an error signal by comparing a difference between the measured first and second time lags with a predetermined time value; and
 a voltage-controlled oscillator controlled in dependent on the error signal to generate the second clock signal.

2. The clock generation system of claim 1, wherein the timer comprises a time-to-voltage converter.

3. The clock generation system of claim 1, further comprising:
 a switch for connecting, in an adjustment mode of the system, the first clock signal instead of the second clock signal to the second frequency divider;
 wherein the difference between the first and second time lags measured in the adjustment mode is multiplied by a factor to obtain the predetermined time value.

4. The clock generation system of claim 1, further comprising:
 a switch for connecting, in an adjustment mode of the system, the first clock signal instead of the second clock signal to the second frequency divider;
 wherein the difference between the first and second time lags measured in the adjustment mode is multiplied by a factor to obtain the predetermined time value.

5. The clock generation system of claim 1, wherein the first and second frequency dividers are configured to adjust the first and second integers.

\* \* \* \* \*